US007068695B2

(12) United States Patent
Tanaka

(10) Patent No.: US 7,068,695 B2
(45) Date of Patent: Jun. 27, 2006

(54) SEMICONDUCTOR LASER ELEMENT

(75) Inventor: Akira Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 10/648,773

(22) Filed: Aug. 25, 2003

(65) Prior Publication Data
US 2004/0120378 A1 Jun. 24, 2004

(30) Foreign Application Priority Data
Aug. 27, 2002 (JP) .............................. 2002-247452

(51) Int. Cl.
*H01S 5/00* (2006.01)

(52) U.S. Cl. ...................... 372/46; 372/44; 372/45; 372/43

(58) Field of Classification Search .................. 372/46
See application file for complete search history.

(56) References Cited

U.S. PATENT DOCUMENTS

| 4,989,050 A | * | 1/1991 | Gaw et al. ...................... 257/13 |
| 5,544,188 A | * | 8/1996 | Takiguchi et al. ............. 372/45 |
| 5,557,700 A | * | 9/1996 | Nakamura et al. ........... 385/122 |
| 6,738,403 B1 | * | 5/2004 | Kuniyasu et al. ............ 372/43 |

FOREIGN PATENT DOCUMENTS

| JP | 2001-015864 | 1/2001 |
| JP | 2001-203423 | 7/2001 |

* cited by examiner

*Primary Examiner*—James Vannucci
(74) *Attorney, Agent, or Firm*—Hogan & Hartson LLP

(57) ABSTRACT

A semiconductor laser element, enhanced in light output power without decreasing the reliability, has a window structure including window regions wider in bandgap than the emission region of the laser, in which the bandgap of the rear window region is narrower than the bandgap of the front window region.

18 Claims, 4 Drawing Sheets

SEMICONDUCTOR LASER ELEMENT

CROSS-REFERENCE TO RELATED APPLICATIONS

This application is based upon and claims the benefits of priority from the prior Japanese Patent Application No. 2002-247452, filed on Aug. 27, 2002, the entire contents of which are incorporated herein by reference.

BACKGROUND OF THE INVENTION

1. Field of the Invention

The present invention relates to a semiconductor laser element, and more particularly, to a semiconductor laser element of a window structure for enhanced light output power.

2. Related Background Art

Recently, semiconductor laser elements using InGaAlP compound semiconductors for wavelengths from 600 nm to 700 nm have advanced to practical use in DVD (digital versatile disk), and have been enhanced in output power to be available for use as write lasers for recordable or rewritable DVD-RAM and others. When such lasers are enhanced in output power, the issue of catastrophic optical damage (COD) arises. Therefore, many lasers of this type have window regions in their laser beam emission edges. The structure having such window regions is called a window structure.

FIG. 5 is a cross-sectional view of a conventional semiconductor laser element having a window structure. This laser element includes an n-type clad layer 202 of $In_{0.5}(Ga_{0.3}Al_{0.7})_{0.5}P$, guide layer 203 of $In_{0.5}(Ga_{0.4}Al_{0.6})_{0.5}P$, active layer 204 having a multiple quantum well (MQW) structure made of $In_{0.5}Ga_{0.5}P/In_{0.5}(Ga_{0.5}Al_{0.5})_{0.5}P$, guide layer 205 of $In_{0.5}(Ga_{0.4}Al_{0.6})_{0.5}P$, p-type clad layer 206 of $In_{0.5}(Ga_{0.3}Al_{0.7})_{0.5}P$, and p-type contact layer 207 of GaAs that are sequentially formed on an n-type GaAs substrate 201. With the supply of a current injected from a p-side electrode 291 and an n-side electrode 292, the active layer 204 emits light from its emission region 232 toward the front edge 210 on the left and the rear edge 220 on the right when viewed on FIG. 5. Near the front edge 210 and the rear edge 220, a front window region 212 and a rear window region 222 shown by hatching are formed by diffusion of zinc from above in the figure. In these window regions 212 and 222, the well layers and the barrier layers of the active layer 204 are alloyed. The front edge 210 is coated by a low-reflectance film 211, and the rear edge 220 by a high-reflectance film 221. Cavity length of the high-power semiconductor laser element of FIG. 5 is 700 to 900 µm, which is slightly longer for a larger gain, and length of each window regions 212 and 222 in the horizontal direction of the figure is around 30 to 40 µm near the active layer 204. The well layers and the barrier layers of the active layer 204 are about 5 nm thick, respectively, and the number of well layers is about three.

In the element of FIG. 5, when Al is introduced into the $In_{0.5}Ga_{0.5}P$ well layers in the window regions 212, 222 from the $In_{0.5}(Ga_{0.5}Al_{0.5})_{0.5}P$ barrier layers, bandgap of the well layers in the window regions 212, 222 is widened. As the bandgap is widened, the bandgap wavelength is shortened. Semiconductors, in general, do not absorb light of wavelengths longer than the bandgap wavelength. Therefore, the well layers of the active layer 204 in the window regions 212, 222, widened in bandgap and shortened in bandgap wavelength, are less likely to absorb light from the well layers of the active layer 204 in the emission region. As a result, optical damage is less likely to occur.

Heretofore, it has been believed that maximizing the bandgap of the window regions 212, 222 to the extent not adversely affecting the operation would be advantageous for better laser properties under the belief that the wider the band gap of the window regions 212, 222, the laser should be enhanced in reliability because of less light absorption and less optical damage in the well layers of the active layer 204 in the window regions 212, 222. Simultaneously, it has been believed that the laser should be enhanced in light output power.

SUMMARY OF THE INVENTION

The Inventor, however, had doubts in the conventional belief that lasers should be enhanced in property of light output power as their bandgaps of the window regions 212, 222 are widened from a result of simulation. Thus for the purpose of further enhancing light output power of semiconductor lasers, the Inventor repeated simulations and experiments under various conditions. As a result, it has been found that the bandgap of the front window region 212 had better be widened to the extent not adversely affecting the operation; however, by limiting the band gap of the rear window region 222 within a certain range, output power of laser light from the front edge 210 can be enhanced. Additionally, it has been confirmed that, within this range, unlikeness of occurrence of optical damage of the rear edge 220 is substantially equivalent to conventional lasers. That is, the Inventor has got the knowledge that, if the band gap of the rear window region 222 is narrowed toward the emission region 232 than the front window region 212, then the semiconductor laser can be enhanced in light output power than conventional lasers while ensuring reliability equivalent to conventional lasers.

The present invention has been made upon recognition of the above-mentioned knowledge. That is, this method has been obtained by the Inventor's own experimental result different from the common knowledge.

According to embodiments of the present invention, there is provided a semiconductor laser comprising:

a substrate;

a clad layer of a first conduction type formed on the substrate;

an active layer formed on the clad layer of the first conduction type and having a multiple well structure alternately stacking well layers of an InGaAlP compound semiconductor and barrier layers of an InGaAlP compound semiconductor to emit light from an emission region thereof toward opposed first and second edges by current injection;

a clad layer of a second conduction type formed on the active layer;

a first window region formed near the first edge, in which the bandgap of the well layers is wider than the bandgap of the well layers in the emission region; and a second window region formed near the second edge, in which the bandgap of the well layers is wider than the bandgap of the well layers in the emission region and narrower than the bandgap of the well layers in the first window region, the difference in wavelength shift between the wavelength of the well layers in the second window region and the wavelength of the well layers in the emission region being from a value equal to or larger than 10 nm to a value equal to or smaller than 30 nm.

According to embodiments of the present invention, there is further provided a semiconductor laser comprising:

a clad layer of a first conduction type;

an active layer formed on the clad layer of the first conduction type to emit light from an emission region thereof toward opposed first ad second edges upon injection of a current;

a clad layer of a second conduction type formed on the active layer;

a first window region formed near the first edge, in which the bandgap of the well layers is wider than the bandgap of the well layers in the emission region;

a second window region formed near the second edge, in which the bandgap of the well layers is wider than the bandgap of the well layers in the emission region and narrower than the bandgap of the well layers in the first window region; and a reflection film formed on the second edge to reflect the light from the active layer.

DETAILED DESCRIPTION OF THE INVENTION

Some embodiments of the invention will now be explained below with reference to the drawings.

(First Embodiment)

Figure 1:
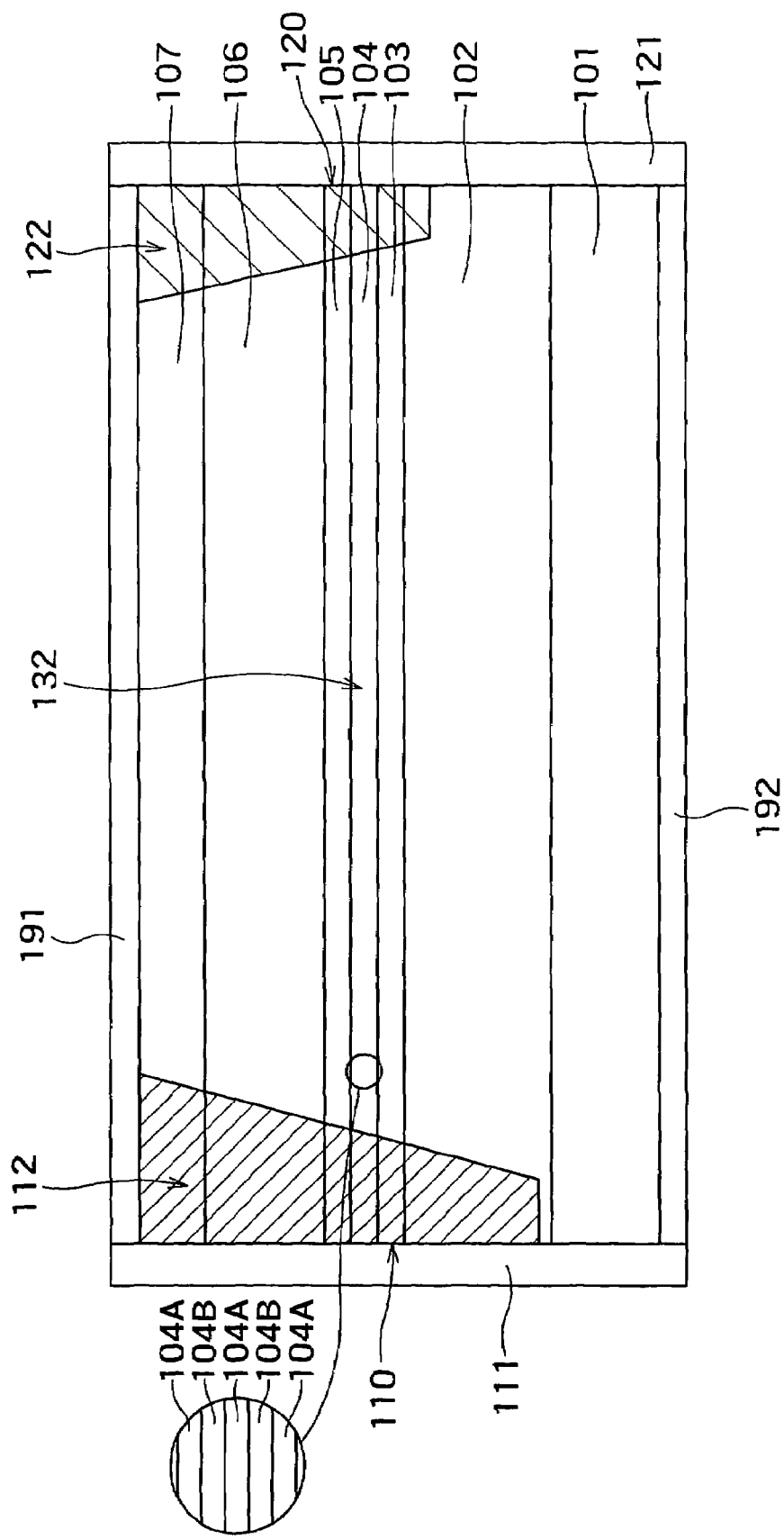
FIG. 1 is a cross-sectional view of a semiconductor laser element according to the first embodiment of the present invention.

FIG. 1 is a cross-sectional view of a semiconductor laser element according to the first embodiment of the present invention. On an n-type GaAs substrate 101, there are sequentially formed an n-type clad layer 102 of $In_{0.5}(Ga_{0.3}Al_{0.7})_{0.5}P$, guide layer 103 of $In_{0.5}(Ga_{0.4}Al_{0.6})_{0.5}P$, active layer 104, guide layer 105 of $In_{0.5}(Ga_{0.4}Al_{0.6})_{0.5}P$, p-type clad layer 106 of $In_{0.5}(Ga_{0.3}Al_{0.7})_{0.5}P$, and p-type contact layer 107 of GaAs. The active layer 104 has a multiple well structure alternately stacking well layers 104A of $In_{0.5}Ga_{0.5}P$ and barrier layers 104B of $In_{0.5}(Ga_{0.5}Al_{0.5})_{0.5}P$. The active layer 104 is supplied with a current injected from a p-side electrode 191 shown as the top layer and an n-side electrode 192 shown as the bottom layer in the figure. With the injection of the current, the active layer emits light of a wavelength from 600 to 700 nm from its emission region 132 toward the front edge (first edge) 110 on the left and the rear edge (second edge) 120 on the right when viewed on FIG. 1.

Near the front edge 110 and the rear edge 120, a front window region (first window region) 112 and a rear window region (second window region) 122 are formed by diffusion of zinc from above in the figure. In these window regions 112 and 122, the well layers 104A and the barrier layers 104B of the active layer 104 are alloyed. For easier alloying, the well layers 104A and the barrier layers 104B of the active layer 104 are about 4 nm thick, respectively, and the number of well layers 104A is about three. As a result of the alloying, the well layers 104A in the front window region 112 and the rear window region 122 are widened in bandgap and shortened in bandgap wavelength than the well layers 104A in the emission region. Thereby, light absorption of the front window region 112 and the rear window region 122 is reduced, and optical damage is prevented.

The front edge 110 is coated by a low-reflectance film 111, and the rear edge 120 by a high-reflectance film 121. The high-reflectance film 121 has a reflectance as high as 60% or more to light from the emission region 132 of the active layer 104, and reflects the light toward the front edge 110. This embodiment uses as film having a reflectance from 90 to 95% as the high-reflectance film. On the other hand, the front edge 110 is coated by the low-reflectance film 111 for enhancing the optical power of the laser beam. In this embodiment, reflectance of the low-reflectance film 111 is about 10%. Light reflected from the high-reflectance film 121 and the low-reflectance film 111 is amplified to a laser beam, and output from the front edge 110. The low-reflectance film 111 is formed in front of a heat sink for heat radiation.

One of features of the semiconductor laser element shown in FIG. 1 lies in the bandgap wavelength shift (decrease) of the front window region 112 being as large as 50 nm whereas the bandgap wavelength shift of the rear window region 122 is as small as 20 nm. In other words, it is characterized in narrowing the bandgap of the well layers 104A of the rear window region 122 than the bandgap of the well layers 104A of the front window region 112. More specifically, if the bandgap wavelength of the well layer 104A in the emission region 132 is $(\lambda)\mu m$ and its bandgap is $(1.24/\mu)$ eV, then the bandgap wavelength of the front window region 112 is $(\lambda-0.05)\ \mu m$, its bandgap wavelength shift (decrease) is 50 nm, and its bandgap is $\{1.24/(\lambda-0.05)\}$ eV. In contrast, the bandgap wavelength of the well layers 104A of the rear window region 122 is $(\lambda-0.02)\ \mu m$, its bandgap wavelength shift (decrease) is 20 nm, and its bandgap is $\{1.24/(\lambda-0.02)\}$ eV. As to the length of each window region along the direction from rear edge 120 toward the front edge 110 in the active layer 104, the front window region 112 is as long as 30 to 40 μm, but the rear window region 122 is as short as 25 μm. This difference can be made, for example, by diffusing zinc once into the rear window region 122 while diffusing zinc twice into the front window region 112.

In the semiconductor laser element explained above with reference to FIG. 1, which has the window structure with the window regions 112, 122 wider in band gap than the emission region 132, since the bandgap of the rear window region 122 is narrower than the bandgap of the front window region 112, light output power can be enhanced while high reliability is maintained. In other words, in the semiconductor laser element of the window structure having the window regions 112, 122 shorter in bandgap wavelength than the emission region 132, since the bandgap wavelength of the rear window region 122 is longer than the bandgap wavelength of the front window region 112, the semiconductor laser can be enhanced in property. Additionally, the semiconductor laser can be enhanced in light output power by shortening the length of the rear window region 122.

Figure 5:
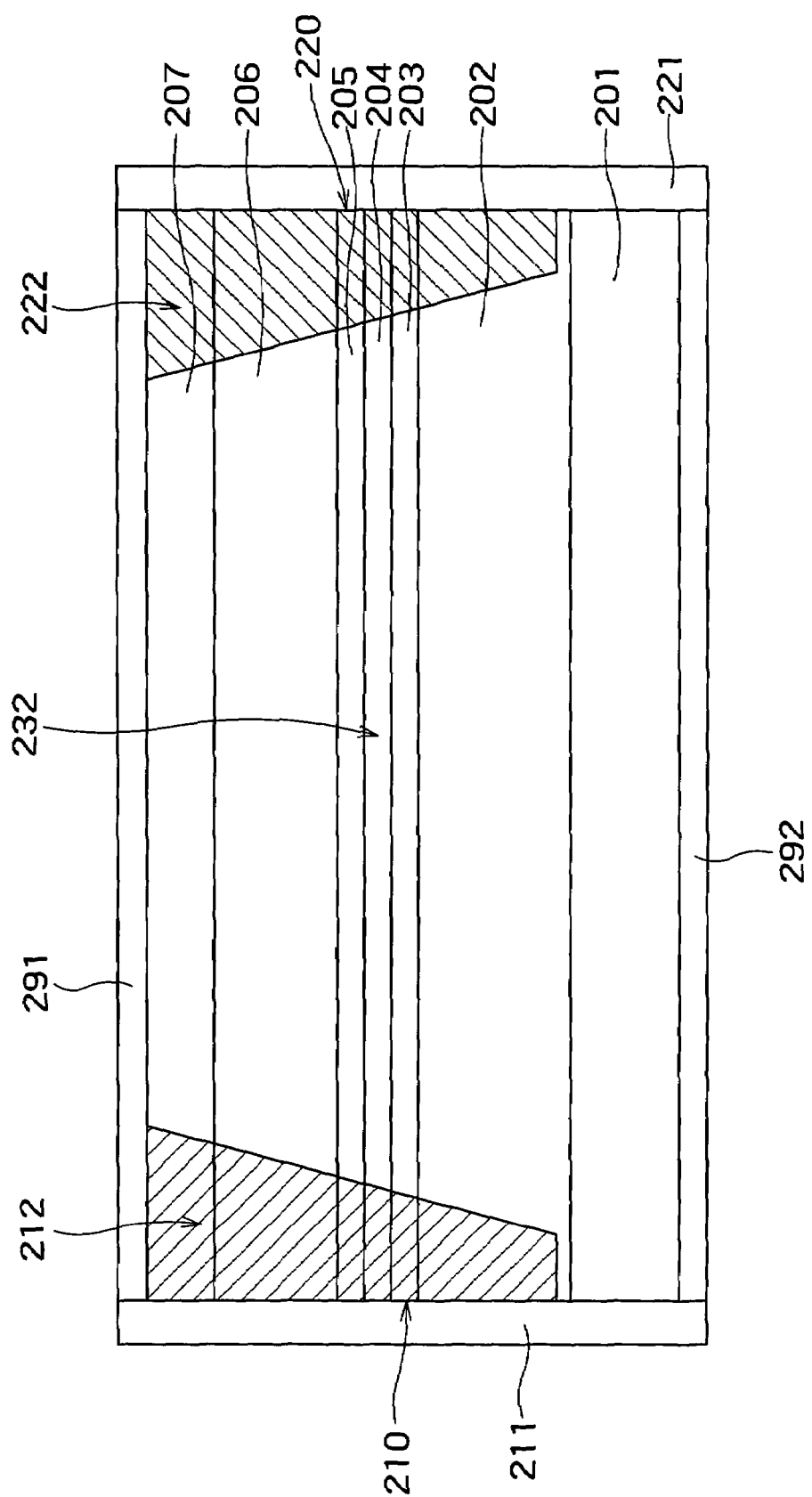
FIG. 5 is a cross-sectional view showing a conventional semiconductor laser element.

The Inventor actually measured light output power (Power) of the laser element of FIG. 1 in operation under 100 mA and could read about 150 mW. In contrast, with a conventional laser element (FIG. 5) in which the front window region 212 and the rear window region 222 equally had the bandgap wavelength shift of 50 nm and the length of 30 to 40 nm, light output power was approximately 125 mW. That is, in the laser element of FIG. 1, light output power could be enhanced by approximately 20% as compared with the conventional laser element while maintaining unlikeness of optical damage and reliability equivalent to those of the conventional laser element.

It must be unimaginable for ordinary engineers to reduce the bandgap wavelength shift of the rear window region 122 because reduction of the bandgap wavelength shift of the rear window region 122 must result in an increase of light absorption in the rear window region 122. The inventor, however, obtained a result different from the common knowledge in the art through simulation and experiments. The inventor assumes that its reason lies in the following mechanism.

First explained is the Inventor's assumption about enhancement of the light output power. Certainly, if no changes occur in emission from the well layer 104A of the active layer 104 in the emission region 132, the rear window region 122 having the bandgap wavelength shift of 20 nm rather than 50 nm must absorb more light, and the light output power must decrease. Actually, however, changes in bandgap wavelength of the rear widow region 122 must change the mode gain profile and light output profile inside the laser element. Then, the advantage of obtaining adequate mode gain profile and light output power must surpass the disadvantage of increasing light absorption in the rear window region 122 and must enhance the light output power.

As to the reason not inviting optical damage and not decreasing the reliability, the Inventor presumes as follows. On the front face, the low-reflectance film is coated for enhancing the output power, and it is located in front of a heat sink for heat radiation purposes. Thus, the front side is more liable to increase in temperature than the rear side and hence subject to optical damage. Therefore, unless the bandgap wavelength shift of the front window region 112 is sufficiently large, reliability of the laser element will decrease. In contrast, temperature of the rear window region 122 is less likely to rise than the front window region 112. It is therefore presumed that the laser element does not lose reliability so much even when the bandgap wavelength shift of the rear window region 122 is not so large as that of the front window region 112.

In this manner, the laser element of FIG. 1 can be enhanced in light output power while keeping high reliability. In the structure shown in FIG. 1, the electric characteristic of the p-n junction in the window regions deviates from the electric characteristic of active layer 104 in the emission region 132 due to diffusion of zinc. Therefore, malfunction by overflow of a. current into the window regions 112, 122 does not occur.

Next made is a review on the bandgap wavelength shift and the range of length of the rear window region 122. In the semiconductor laser shown in FIG. 1, the bandgap wavelength shift of the rear window region 122 is 20 nm, and its length is 25 µm as already explained. However, these values may be modified when manufacturing the laser. A review is made below on acceptable range of the modification with reference to FIGS. 2 and 3.

Figure 2:
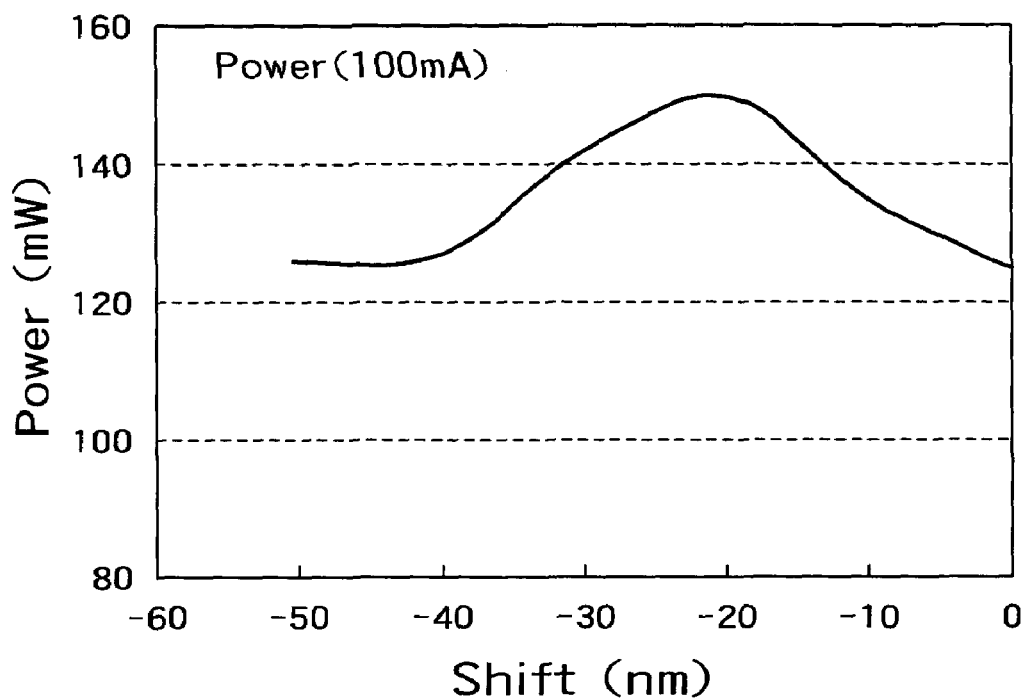
FIG. 2 is a diagram showing a relationship between changes of the band gap of the rear window region and the light output power in the semiconductor laser element according to the first embodiment.

FIG. 2 is a diagram showing changes in light output power when the bandgap wavelength of the rear window region 122 shifts in an element having the rear window region with the bandgap wavelength shift of 50 nm and the length of 30 to 40 µm. It is appreciated from FIG. 2 that the light output power of the laser element is maximized when the bandgap wavelength shift of the rear window region 122 is 10 to 30 nm or preferably 20 to 30 nm as the amount of decrease. It is further appreciated that, when the bandgap wavelength shift is 20 nm as proposed in this embodiment, optical output power increases by approximately 20% from the conventional laser element in which the bandgap wavelength shift is 50 nm. This is probably because the appropriate range of the bandgap wavelength shift contributes to the advantage of obtaining adequate mode gain profile and light output profile, surpassing the disadvantage of light absorption in the rear window region 122.

Figure 3:
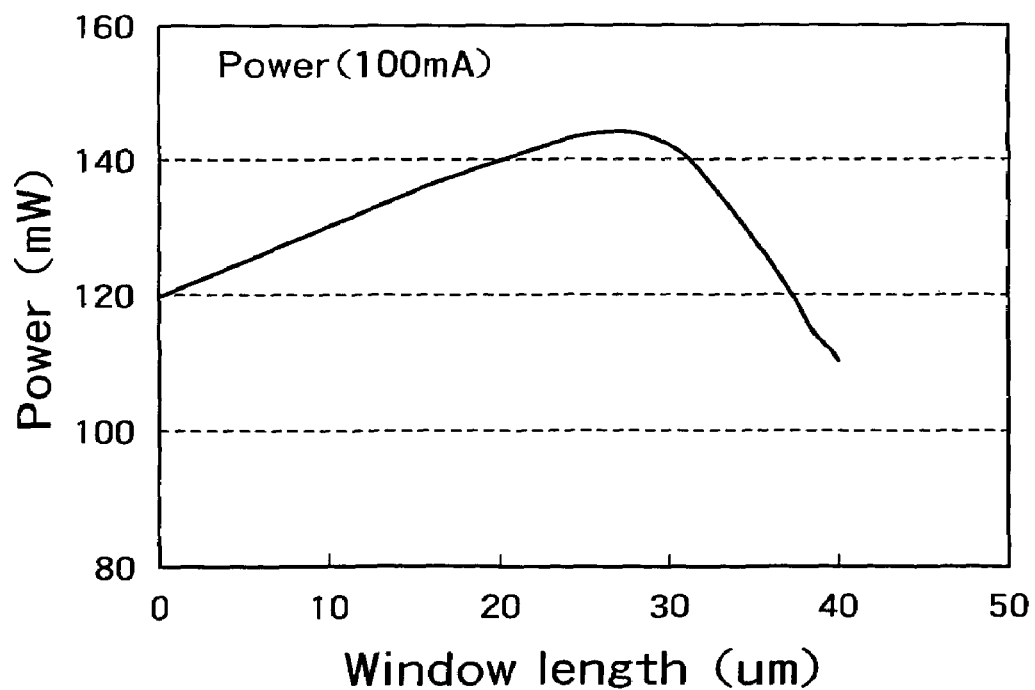
FIG. 3 is a diagram showing a relationship between the length of the rear window region and the light output power in the semiconductor laser element according to the first embodiment.

FIG. 3 is a diagram showing changes in light output power (Power) with the length of the rear window region 122 in an element in which the bandgap wavelength shift of the front window region 112 is 50 nm, and its length is 30 to 40 nm. The bandgap wavelength shift of the rear window region 122 is 30 nm. It is appreciated from FIG. 3 that the output power is optimum when the length of the rear window region is in the range from 20 to 30 µm. Here again, this is probably because the advantage of adequate mode gain profile and light output power is great.

As such, the laser can be improved in property by adjusting the bandgap wavelength shift of the rear window region 122 in 10 to 30 nm and the length thereof in 20 to 30 µm.

Taking the results of FIGS. 2 and 3 into consideration, the Inventor further made a review about the adequate range of bandgap wavelength shift of the front window region 112. As a result, with any value within 40 to 80 nm of the bandgap wavelength shift of the front window region 112, favorable elements equivalent to the element of FIG. 1 could be obtained. In contrast, when the bandgap wavelength shift of the front window region 112 was less than 40 nm, it invited a decrease of the optical output power, liability of optical damage and hence a decrease of the reliability. These phenomena may be considered a result of an increase of light absorption in the front window region 112. When the Inventor tried to increase the bandgap wavelength shift beyond 80 nm, because of excessive decrease of the difference in bandgap between the well layers 104A and the barrier layers 104B of the active layer 104, errors occurred in operation.

(Second Embodiment)

Figure 4:
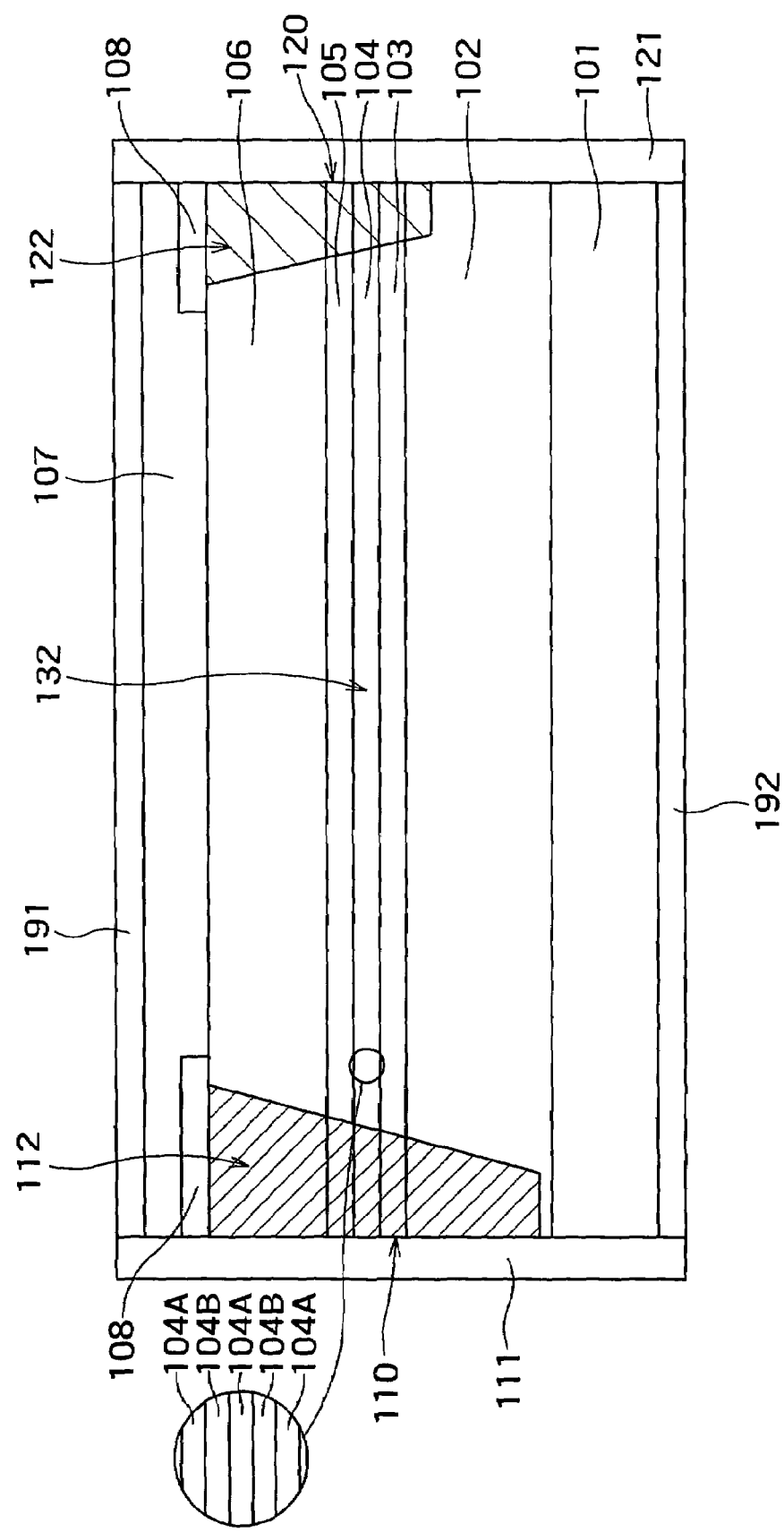
FIG. 4 is a cross-sectional view showing a semiconductor laser element according to the second embodiment of the present invention.

FIG. 4 is a cross-sectional view of a semiconductor laser element according to the second embodiment of the invention. The element of FIG. 4 has a structure similar to the element according to the first embodiment (FIG. 1), but made by first forming the layers up to the $In_{0.5}(Ga_{0.3}Al_{0.7})_{0.5}P$ p-type clad layer 106 by crystal growth, thereafter forming the window regions 112, 122, then forming a current blocking layer 108 of n-type GaAs to minimize the current flow into the window regions 112, 122, and thereafter forming the p-type contact layer 107 on the entire surface. In the other respects of the structure, the element shown here is substantially the same as the element according to the first embodiment (FIG. 1), and details thereof are not explained here.

In the structure of FIG. 4, the current blocking layer 108 contributes to more reliably reducing the current injection into the window regions 112, 122 and more reliably preventing the rise of temperature.

The structure of FIG. 4 includes the current blocking layer 108 on the left in the figure to block the current injection to the front window region 112 the current blocking layer on the right to block the current injection to the rear window region 122. However, also when the element includes the current blocking layer 108 only for blocking the current injection to the rear window region 122, the function of preventing the temperature rise is sufficiently effective.

In any of the semiconductor elements explained above as embodiments of the invention, the well layers 104A and the barrier layers 104B of the active layer 104 are 4 nm thick each. However, the thickness may be 5 nm or less. However, if it is thicker than 5 nm, alloying in the window regions 112, 122 is difficult.

In the foregoing description of the embodiments, the semiconductor elements have been explained as using InGaAlP compound semiconductors for wavelengths from 600 to 700 nm. However, laser elements of other compounds also ensure the same effects provided they have a window structure including window regions 112, 122 wider in bandgap than the emission region 132 and the bandgap of the rear window region 122 is narrower than the bandgap of the front window region 112.

Additional advantages and modifications will readily occur to those skilled in the art. Therefore, the invention in its broader aspects is not limited to the specific details and representative embodiments shown and described herein. Accordingly, various modifications may be made without departing from the spirit or scope of general inventive concept as defined by the appended claims and their equivalents.

What is claimed is:

1. A semiconductor laser comprising:
    a substrate;
    a clad layer of a first conduction type formed on the substrate;
    an active layer formed on the clad layer of the first conduction type and having a multiple well structure alternately stacking well layers of an InGaAlP compound semiconductor and barrier layers of an InGaAlP compound semiconductor to emit light from an emission region by current injection toward first and second edges disposed oppositely in a propagation direction of light emitted from the emission region;
    a clad layer of a second conduction type formed on the active layer;
    a first window region formed near the first edge, in which the bandgap of the well layers is wider than the bandgap of the well layers in the emission region; and
    a second window region formed near the second edge, in which the bandgap of the well layers is wider than the bandgap of the well layers in the emission region and narrower than the bandgap of the well layers in the first window region, the difference in wavelength shift between the wavelength of the well layers in the second window region and the wavelength of the well layers in the emission region being from a value equal to or larger than 10 nm to a value equal to or smaller than 30 nm.

2. A semiconductor laser according to claim 1 further comprising a high-reflectance film formed on the second edge having reflectance equal to or higher than 60% to the light from the active layer.

3. A semiconductor laser according to claim 1 wherein the difference in wavelength shift between the bandgap of the well layers in the emission region and the bandgap of the well layers in the first window region is from a value equal to or larger than 40 nm to a value equal to or smaller than 80 nm.

4. A semiconductor laser according to claim 1 wherein the second window region has a length from a value equal to or longer than 20 μm to a value equal to or shorter than 30 μm in the active layer along the direction from the second edge toward the first edge.

5. A semiconductor laser according to claim 1 further comprising a current blocking layer for preventing current injection into the second window region.

6. A semiconductor laser according to claim 1 wherein the well layers have a thickness of 5 nm or less, and the barrier layers of the active layer have a thickness of 5 nm or less.

7. A semiconductor laser comprising:
    a clad layer of a first conduction type;
    an active layer formed on the clad layer of the first conduction type to emit light upon injection of a current from an emission region first toward first and second edges oppositely in a propagation direction of light emitted from the emission region;
    a clad layer of a second conduction type formed on the active layer;
    a first window region formed near the first edge, in which the bandgap of the well layers is wider than the bandgap of the well layers in the emission region;
    a second window region formed near the second edge, in which the bandgap of the well layers is wider than the bandgap of the well layers in the emission region and narrower than the bandgap of the well layers in the first window region; and
    a reflection film formed on the second edge to reflect the light from the active layer.

8. A semiconductor laser according to claim 7 wherein the active layer is made of an InGaAlP compound semiconductor.

9. A semiconductor laser according to claim 8 wherein the active layer has a multiple well structure alternately stacking well layers of an InGaAlP compound semiconductor and barrier layers of an InGaAlP compound semiconductor.

10. A semiconductor laser according to claim 8 wherein the difference in wavelength shift between the wavelength of the well layers in the second window region and the wavelength of the well layers in the emission region is from a value equal to or larger than 10 nm to a value equal to or smaller than 30 nm.

11. A semiconductor laser according to claim 8 wherein the reflection film formed on the second edge has a having reflectance equal to or higher than 60% of the light from the active layer.

12. A semiconductor laser according to claim 8 wherein the difference in wavelength shift between the bandgap of the well layers in the emission region and the bandgap of the well layers in the first window region is from a value equal to or larger than 40 nm to a value equal to or smaller than 80 nm.

13. A semiconductor laser according to claim 8 wherein the second window region has a length from a value equal to or longer than 20 μm to a value equal to or shorter than 30 μm in the active layer along the direction from the second edge toward the first edge.

14. A semiconductor laser according to claim 8 further comprising a current blocking layer for preventing current injection into the second window region.

15. A semiconductor laser according to claim 9 wherein the well layers has a thickness of 5 nm or less, and the barrier layers of the active layer have a thickness of 5 nm or less.

16. A semiconductor laser according to claim 3 wherein the second window region has a length from a value equal to or longer than 20 nm to a value equal to or shorter than 30 nm in the active layer along the direction from the second edge toward the first edge.

17. A semiconductor laser according to claim 10 wherein the difference in wavelength shift between the bandgap of the well layers in the emission region and the bandgap of the well layers in the first window region is from a value equal to or larger than 40 nm to a value equal to or smaller than 80 nm.

18. A semiconductor laser according to claim 17 further comprising a current blocking layer for preventing current injection into the second window region.

\* \* \* \* \*